United States Patent
Polland et al.

(10) Patent No.: US 9,658,269 B2
(45) Date of Patent: May 23, 2017

(54) SYSTEMS AND METHODS FOR CONNECTORS WITH INSERTION COUNTERS

(71) Applicant: ADC Telecommunications, Inc., Berwyn, PA (US)

(72) Inventors: Joseph Polland, Eden Prairie, MN (US); Joseph C. Coffey, Burnsville, MN (US)

(73) Assignee: CommScope Technologies LLC, Hickory, NC (US)

( * ) Notice: Subject to any disclaimer, the term of this patent is extended or adjusted under 35 U.S.C. 154(b) by 34 days.

(21) Appl. No.: 14/685,226

(22) Filed: Apr. 13, 2015

(65) Prior Publication Data

US 2016/0097801 A1    Apr. 7, 2016

Related U.S. Application Data

(60) Provisional application No. 62/058,897, filed on Oct. 2, 2014.

(51) Int. Cl.
*H01R 13/703* (2006.01)
*G01R 31/04* (2006.01)
(Continued)

(52) U.S. Cl.
CPC .......... *G01R 31/04* (2013.01); *G02B 6/3895* (2013.01); *H01R 13/665* (2013.01);
(Continued)

(58) Field of Classification Search
CPC combination set(s) only.
See application file for complete search history.

(56) References Cited

U.S. PATENT DOCUMENTS 7,049,937 B1 *   5/2006   Zweig ................. H01R 13/641
                                                              324/66
7,321,313 B1    1/2008   Inlow
(Continued)

FOREIGN PATENT DOCUMENTS

KR    1020120057039    6/2012

OTHER PUBLICATIONS

International Search Authority, "International Search Report and Written Opinion from Application No. PCT/US2015/025578", "From Foreign Counterpart to U.S. Appl. No. 14/685,226", Jul. 8, 2015, pp. 1-14, Published in: WO.

(Continued)

*Primary Examiner* — Clayton E LaBalle
*Assistant Examiner* — Jas Sanghera
(74) *Attorney, Agent, or Firm* — Fogg & Powers LLC

(57) ABSTRACT

Systems and methods for connectors with insertion counters are provided. In one embodiment, a connector comprises: an interface configured to interface with a corresponding interface of a port to communicate signals between the port and a cable attached to the connector; at least one switch configured to change from a first state to a second state when the connector is inserted into the port; and a microcontroller configured to record insertion events, wherein the microcontroller increments an insertion count stored within the microcontroller when the at least one switch transitions from the first state to the second state.

20 Claims, 6 Drawing Sheets

(51) Int. Cl.
*G02B 6/38* (2006.01)
*H01R 13/66* (2006.01)
*H01R 31/06* (2006.01)
*H01R 13/717* (2006.01)
*H01R 24/64* (2011.01)

(52) U.S. Cl.
CPC ......... *H01R 13/703* (2013.01); *H01R 31/065* (2013.01); *G01R 31/045* (2013.01); *H01R 13/7175* (2013.01); *H01R 24/64* (2013.01)

(56) References Cited

U.S. PATENT DOCUMENTS

| | | | |
|---|---|---|---|
| 2010/0273363 A1* | 10/2010 | Orris | H01R 13/432 439/745 |
| 2011/0092100 A1* | 4/2011 | Coffey | H01R 13/641 439/620.22 |
| 2011/0252183 A1* | 10/2011 | Cho | H03M 7/30 711/102 |
| 2011/0264968 A1 | 10/2011 | Shilo et al. | |
| 2012/0246362 A1 | 9/2012 | Anne et al. | |
| 2013/0034990 A1* | 2/2013 | Warren | H01R 13/7175 439/490 |
| 2014/0211351 A1 | 7/2014 | Shoykhet et al. | |

OTHER PUBLICATIONS

Coffey, Joseph C., "Quareo Plug Identification and Detection Technology", "Proceedings of the 61st IWCS Conference", 2012, pp. 351-360, Publisher: International Wire & Cable Symposium.

\* cited by examiner

SYSTEMS AND METHODS FOR CONNECTORS WITH INSERTION COUNTERS

CROSS-REFERENCE TO RELATED APPLICATIONS

This U.S. Patent Application claims priority to, and the benefit of, U.S. Provisional Patent Application No. 62/058,897, titled "CONNECTORS WITH INSERTION COUNTERS" filed on Oct. 2, 2014.

BACKGROUND

An insertion count is a count of the number of times a connector or plug has been inserted into a port. Manufacturer warranty typically allows for a fixed number of insertions, before the connector is considered degraded and exceeds the manufacturer warranty. For example, a manufacture warranty may allow for a few hundred inserts before the manufacturer warranty is exceeded.

For the reasons stated above and for other reasons stated below which will become apparent to those skilled in the art upon reading and understanding the specification, there is a need in the art for alternate systems and methods for connectors with insertion counters.

SUMMARY

The Embodiments of the present invention provide methods and systems for connectors with insertion counters and will be understood by reading and studying the following specification.

Systems and methods for connectors with insertion counters are provided. In one embodiment, a connector comprises: an interface configured to interface with a corresponding interface of a port to communicate signals between the port and a cable attached to the connector; at least one switch configured to change from a first state to a second state when the connector is inserted into the port; and a microcontroller configured to record insertion events, wherein the microcontroller increments an insertion count stored within the microcontroller when the at least one switch transitions from the first state to the second state.

DRAWINGS

Understanding that the drawings depict only exemplary embodiments and are not therefore to be considered limiting in scope, the exemplary embodiments will be described with additional specificity and detail through the use of the accompanying drawings, in which.

Figure 2:
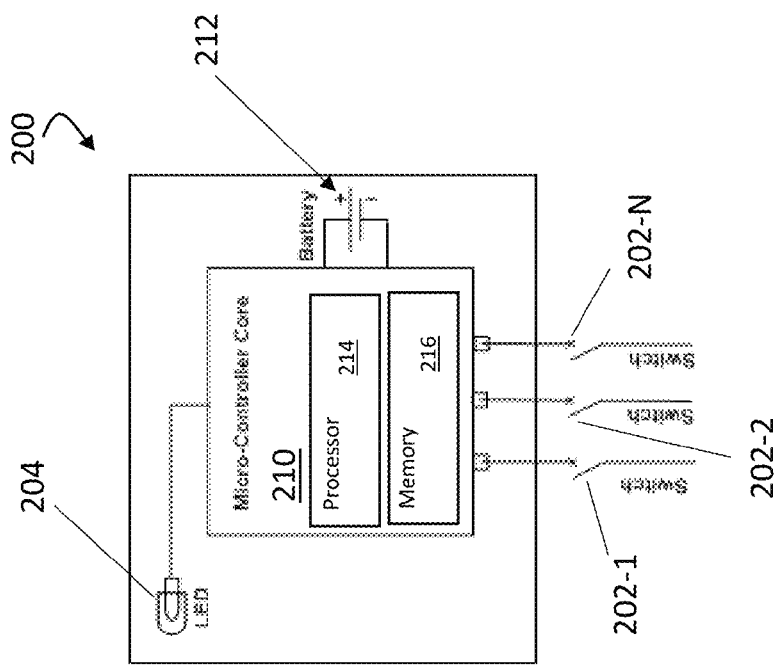
FIG. 2 is a circuit diagram of one embodiment of an exemplary intelligent connector.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

The embodiments described below enable various advantages over existing insertion count systems. For example, the embodiments described below enable tracking insertions counts of both managed and unmanaged connectors in both managed and unmanaged systems, as described in more detail below. Additionally, the embodiments described below solve potential insertion count errors that may occur in existing insertion count systems, as described in more detail below.

Figure 1:
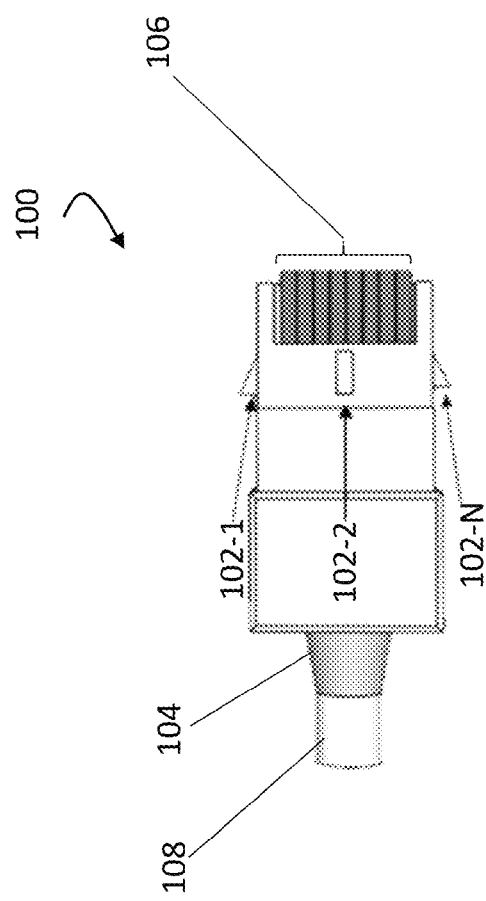
FIG. 1 is a top view of one embodiment of an exemplary intelligent connector.
Figure 3:
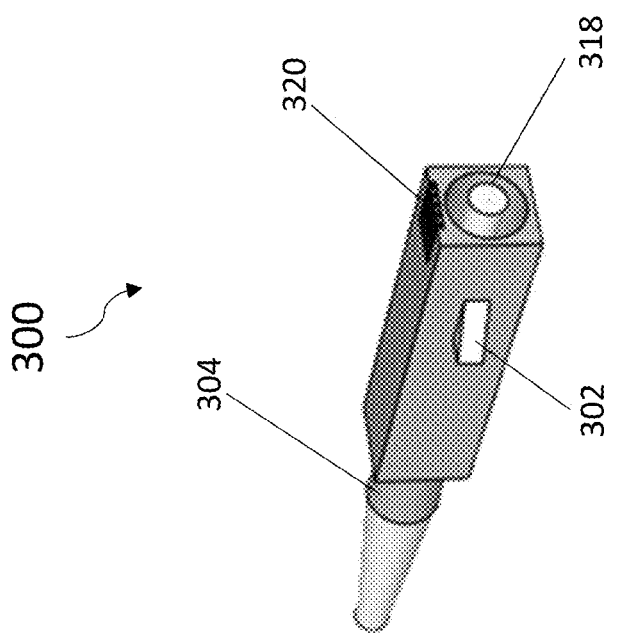
FIG. 3 is a perspective view of one embodiment of another exemplary intelligent connector.

FIG. 1 is a top view of one embodiment of an exemplary intelligent connector 100 configured to self-track the number of times the intelligent connector 100 is inserted into a port or mating connector. As used herein, the term "self-track" means that the connector 100 is configured to maintain a record of insertion counts without utilizing an external system. In particular, connector 100 includes a plurality of switches 102-1 . . . 102-N. In this example, there are three separate switches 102. However, it is to be understood that in other embodiments more switches (e.g. more than three) or fewer (e.g. 1 or 2) switches can be used. The connector 100 also includes an interface 106 for communicating signals between a port and a cable 108 attached to the connector 100. As shown in this example, the connector 100 is a registered jack (RJ) 45 connector with an associated interface 106. However, it is to be understood that other connector types for electrical and/or optical fiber cables can be implemented in other embodiments. For example, FIG. 3 depicts an exemplary connector 300 implemented as an optical fiber LC connector (Lucent Connector). The techniques described herein can also be used with other types of connectors including, but not limited to, (Bayonet Neill-Concelman) BNC connectors, F connectors, DSX jacks and plugs, bantam jacks and plugs, Multi-Fiber Push On (MPO) connectors, MTP multi-fiber connectors, optical fiber SC connector (Subscriber Connector), FC fiber connectors, LX.5 fiber connectors, RJ11, RJ25, RJ48, or other modular connectors and fiber optic connectors.

In this embodiment, the connector 100 also includes a visual indicator 104 which can be used to identify certain states of the connector. For example, the visual indicator 104 can be one or more light emitting diodes (LED) configured to illuminate different colors depending on the state of the connector. For example, if the maximum allowed number of insertion counts has been exceeded, the visual indicator 104 can display a red color (e.g. illuminate a red LED). Similarly, if the number of insertion counts is approaching the maximum allowed, another color can be displayed as a warning, such as a yellow or orange. Additionally, in some embodiments, another color can be displayed, such as green, to indicate that the number of insertion counts is below the maximum allowed number by more than some pre-determined amount or threshold. In other embodiments, rather than different colors, different blinking patterns of a single color can be used to indicate the state of the connector 100 regarding the number of recorded insertion counts. In some embodiments, the visual indicator 104 is located on the rear of the connector at the cable exit. In such embodiments, the visual indicator 104 is visible even when the connector is plugged into a port. Additionally, in some embodiments, when the connector 100 is first plugged into a port, the visual indicator 104 is flashed to show that the connector is functioning and has power. In such embodiments, if the visual indicator 104 does not flash upon initial insertion, the connector is not operating properly.

In operation, when the connector 100 is inserted into a port, the one or more switches 102 are closed. A microcontroller within the connector 100 detects the closure and, after de-bouncing, recognizes a valid port insertion event. As understood by one of skill in the art, switch de-bouncing ensures that only one signal can be registered for each switch within the space of a given time. In this way, a single insertion event does not appear as multiple insertions due to the bouncing. The connector 100 is configured to maintain an insertion count internally and is programmed at manufacture time with a maximum insertion count, such as a manufacturer's warranty maximum insertion count. The connector 100 also maintains a current insertion count, which is initially set to zero at time of manufacture. When the current insertion count exceeds the maximum insertion count, the LED 104 is illuminated.

For example, FIG. 2 is an exemplary circuit diagram of one embodiment of a connector 200 which can be used to implement the connector 100. As shown in FIG. 2, the connector 200 includes a microcontroller 210 having a processor 214 and memory 216. As understood to one of skill in the art, a microcontroller is a relatively small device which has low power consumption (e.g. milliwatt to nanowatt) as compared to general purpose processors used in personal computers, for example. In some embodiments, the microcontroller 210 stays in a low power or sleep mode until activated by one or more of the switches 202 being closed. Additionally, as with typical microcontrollers, the microcontroller 210 can be implemented as a single integrated circuit.

The memory 216 can store program instructions for execution by the processor 214 to recognize insertion events and increment an insertion count. Additionally, the memory 216 is used to store the incremented insertion count. The memory 216 can be implemented using any suitable memory such as an Electrically Erasable Programmable Read Only Memory (EEPROM), flash memory, etc. The microcontroller 210 may also include a small amount of random access memory (RAM) as understood by one of skill in the art.

The connector 200 also includes a battery 212 and an LED 204 coupled to the microcontroller 210. The battery 212 provides power to the microcontroller 210 for incrementing the insertion count. In some embodiments, the battery 212 can be recharged by power received from the port over a corresponding power line. In some embodiments, the battery 212 can be replaced when depleted. Additionally, in some embodiments, the microcontroller 210 can cause the LED 204 to illuminate a specific color or pattern to indicate a low battery condition. In some embodiments, the battery 212 is not included and the microcontroller 210 is only powered from the port via a corresponding power line.

As stated above, in some embodiments, only a single switch is used. In other embodiments, a plurality of switches are used. In embodiments, with more than one switch, the microcontroller 210 processes the state of several switches to confirm port insertion. Using multiple switches reduces or eliminates false insertion counts, such as from a person's finger accidentally depressing the switch, for example. In some embodiments using a plurality of switches 202, all of the switches 202 must be closed to detect a port insertion. In other embodiments, a majority of closed switches 202 is interpreted as a port insertion (e.g. 2 out of 3 switches are closed). It should be noted that the discussion above is based on a normally open state for each of the switches. However, it is to be understood that one or more of the switches could be implemented with a normally closed state. For such switches, insertion of the connector 200 causes the normally closed switch to open. In addition, the switches 202 can be implemented with various types of switches, such as mechanical metal contacts and/or with capacitive switches having no moving mechanical parts. For example, the capacitive switches may each comprise an electrode having no mechanical part that is flat against the surface of the connector 200.

In addition, in some embodiments, depressing or otherwise activating the one or more switches 202 in a specific pre-determined pattern can cause the microcontroller 210 to illuminate the LED 204 indicating the insertion count status. For example, a user may wish to determine whether the maximum insertion count has been exceeded without plugging the cable into another device. By activating the switches in the pre-determined pattern, the microcontroller 210 causes the LED 204 to display a specific color or blinking pattern which indicates to the user if the maximum insertion count has been exceeded. In addition, a user may check for a low battery by depressing the switches in a unique sequence, such as by holding down one of the switches 202 for a fixed time period. A low battery condition is then indicated by a specific color and/or blinking pattern. Furthermore, it is to be understood that the illumination of the LED 204 does not have to be continuous. For example, the microcontroller 210 can cycle or blink the LED 204 at a given rate, such as 50-60 Hz. The human eye may not be able to discern the rapid turn on and off of the LED 204. However, this cycling can conserve power versus turning the LED 204 on continuously.

Figure 5:
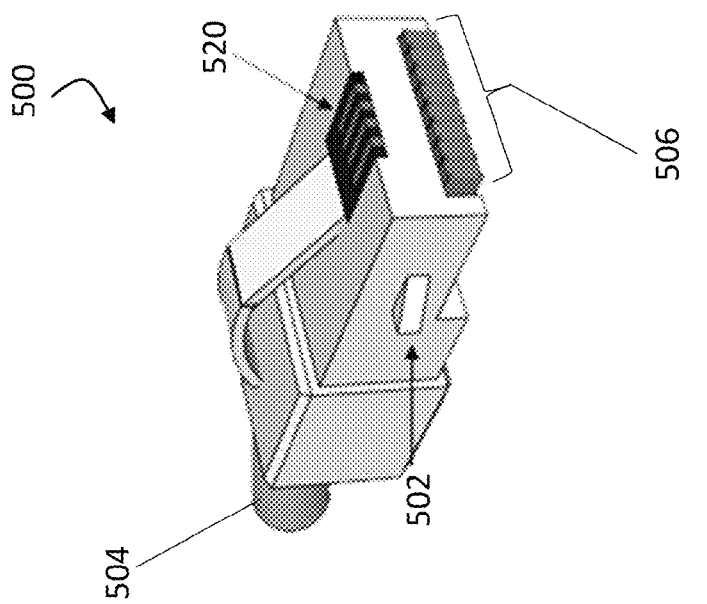
FIG. 5 is a perspective view of one embodiment of another exemplary intelligent connector.

Thus, the connector 200 can be used alone without needing a managed system or other device to track and report the insertion count. Additionally, in some embodiments, the connector can be configured with a second interface to allow access to the insertion count data recorded by the microcontroller. For example, in FIG. 3 exemplary connector 300 is implemented as an optical fiber connector having an optical interface 318 for communicating signals between a port and a cable attached to the connector 300. Connector 300 also includes a second interface 320. Connector 300 otherwise includes the same elements and functions as described above for connectors 100 and 200. For example, connector 300 further includes a plurality of switches (one of which is shown at 302) that function in the same manner as discussed for switches 102-1, 2 and 3 above, and a visual indicator 304 that may include one or more light emitting diodes (LED) configured to illuminate different colors depending on the state of the connector (for example, in the same manner as described above in FIG. 1 with respect to visual indicator 104). In FIG. 5, an exemplary connector 500 is implemented as a registered jack (RJ) connector with an associated interface 506 for communicating signals between a port and a cable attached to the connector 500. Connector 500 also includes a second interface 520. Connector 500 otherwise includes the same elements and functions as described above for connectors 100 and 200. For example, connector 500 further includes a plurality of switches (one of which is shown at 502) that function in the same manner as discussed for switches 102-1, 2 and 3 above, and a visual indicator 504 that may include one or more light emitting diodes (LED) configured to illuminate different colors depending on the state of the connector as described above with respect to visual indicator 504. The interfaces 320 and 520 enable an electrical input/output (I/O) connection to the microcontroller with the respective connector 300 and 500. For example, a UNI/O bus compatible interface can be used to implement the interface 320 and 520 in some embodiments. The UNI/O bus was developed by Microchip Technology and is known to one of skill in the art. However, it is to be understood that other interfaces and bus specifications can be used in other embodiments.

Figure 4:
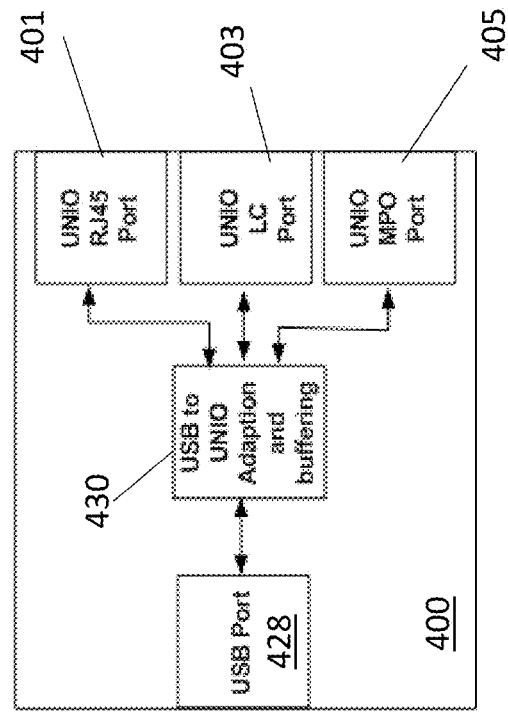
FIG. 4 is a block diagram of one embodiment of an exemplary adapter.

FIG. 4 depicts one embodiment of an exemplary adapter 400. As discussed above, the intelligent connector discussed herein (e.g., connectors 100, 200, 300, 500, 600) can be implemented as any of a variety of different connector types. Hence, the adapter 400 is configured with an RJ45 port 401, an LC connector port 403, and an MPO connector port 405. Hence, the adapter 400 can be used with a plurality of different connector types. The connector 400 also includes a universal serial bus (USB) port 428. Although a USB port is shown in this example, it is to be understood that other ports for interfacing with a computer can be used in other embodiments, such as but not limited to an eSATA port, FireWire port, etc. The adapter 400 also includes circuit 430 configured to provide an interface between the USB port 428 and the respective connector ports, as well as buffer signals as necessary.

Figure 6:
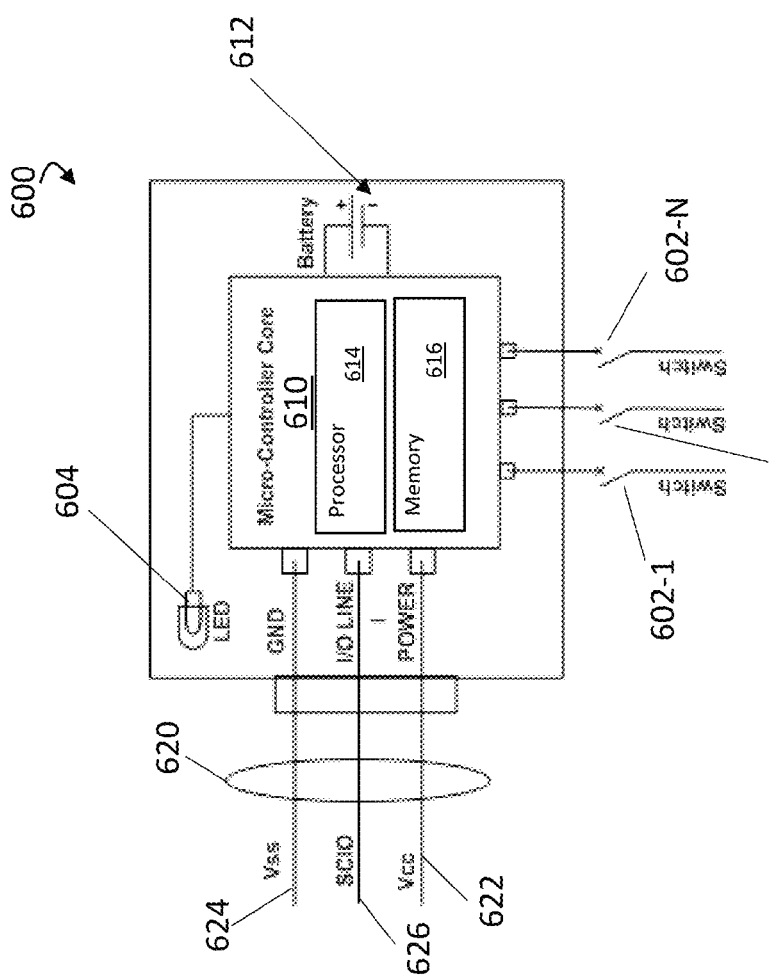
FIG. 6 is a circuit diagram of one embodiment of another exemplary intelligent connector.

An exemplary circuit diagram of one embodiment of a connector 600 (which may provide an implementation for any of connectors 100, 200, 300, 500) having a UNI/O interface 620 is shown in FIG. 6 (which may correspond to the second interfaces 320 and 520 discussed above). As shown in FIG. 6, the interface 620 includes power line 622, ground line 624 and Serial Clock, Data Input/Output (SCIO) line 626. Power for the microcontroller 610 can be received via the power line 622. In addition, the battery 612 can be re-charged by power received via the power line 622, in some embodiments. The SCIO line 626 enables the microcontroller 610 to provide data regarding the insertion count to an external device. For example, in some embodiments, an adapter can be used to enable access to the insertion count value via a computer.

In addition to, or in lieu of, accessing data via a computer, the interface 620 enables a managed system to access the insertion count data recorded by the microcontroller 610. A managed system is a system configured to identify and track information regarding the cables connected to ports of devices managed by the managed system. Exemplary managed systems are described in U.S. application Ser. No. 13/426,821, U.S. application Ser. No. 14/458,974, and U.S. application Ser. No. 14/477,231, each of which is hereby incorporated herein by reference.

In some embodiments, the microcontroller 610 is configured to emulate an EEPROM memory such that a host or managed system, described in more detail below, sees a virtual EEPROM when connected to the connector 600 via the interface 620. For example, the microcontroller 610 includes a processor 614 that emulates the addressable space, read-write/read-only partitions, and Key, Length, Value (KLV) data structures that the host system is configured to access. Additionally, the microcontroller 610 responds to commands from the host system and all existing applicable KLVs for the connector type at the time of manufacture are programmed into non-volatile memory 616 of the controller 610. Hence, the KLVs, such as Unique ID, Manufacturer ID, Date of Manufacturer, Model Info., etc. are available to the host via the interface 620. Thus, in such embodiments, the host or managed device is unaware that the connector 600 self-tracks the insertion count events making the intelligent connector 600 compatible with managed systems as well as unmanaged systems. For example, some managed systems may be configured to read the two KVL insertion count copies from connector 600, increment the count and write back to the connector two copies of the incremented value. However, processor 614 in the connector 600 will not, in reality, use the writes to update the insertion count stored in memory 616. Further, memory 616 and will only keep one actual copy of the incremented value, although processor 614 will present the value to appear like two KVL insertion count copies to the management system accessing the connector.

An exemplary KLV data structure is shown below in Table 1. When a port insertion event is identified, the microcontroller 610 increments an internally maintained insertion count and updates an emulated insertion count KLV. The microcontroller 610 is configured to compare the updated insertion count with the predetermined maximum value (e.g. manufacturer warranty insertion count). If the updated insertion count is greater than the maximum value, the microcontroller 610 causes the LED 604 to illuminate indicating the connector has exceeded the maximum number of insertion events (e.g. the connector is out of warranty). For example, in some embodiments, the LED 604 is illuminated when the insertion count exceeds the predetermined maximum and the connector 600 is inserted into a port. After removal of the connector 600 from the port, the LED 604 can remain illuminated for a short period of time, in some such embodiments, and then become illuminated again when the connector is reinserted.

The microcontroller 610 also may add an insertion count exceeded KLV to the KLV structure. That is, in one implementation, an insertion count exceeded KLV is not present unless the connector's insertion count has exceeded the predetermined limit (for example, a warranty limit). If the insertion count exceeded KLV is not present, the host system know that the warranty is not exceeded.

The insertion count exceeded KLV is added before the host reads the virtual memory emulated by the microcontroller 610. In this way, the host system is able to retrieve the KLV data to determine if the connector 600 is out of warranty. Since the connector 600 self-tracks the port insertion events, the KLVs related to insertion count can be placed in the KLV block to which the host has read only access, in some embodiments.

TABLE 1

| Name | Value |
|---|---|
| Key (insertion Count Exceeded) | New Key Assignment Value |
| Length | Length indication (4 |

TABLE 1-continued

| Name | Value |
| --- | --- |
| | Bytes) |
| Warranty Value | Warranty insertion count |
| Actual Count | Actual Insertion Count. |

Figure 7:
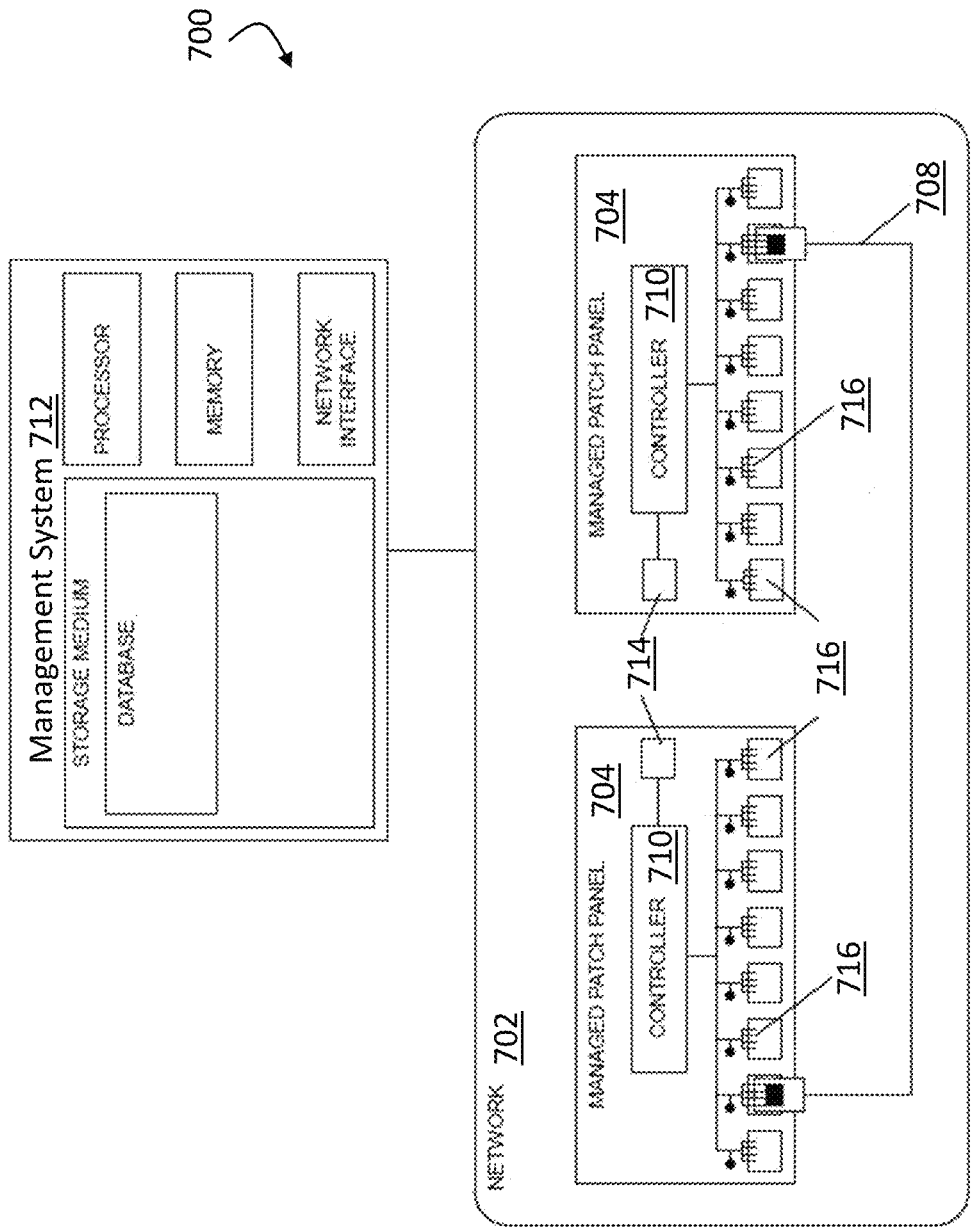
FIG. 7 is block diagram of one embodiment of an exemplary system.

One embodiment of an exemplary managed system 700 is shown in FIG. 7. System 700 is used to track physical layer information related to a network 702. As used herein, "physical layer information" comprises information about the cabling, connections, and communication links that exist in the network 702. In the exemplary embodiment shown in FIG. 7, the network 702 includes various network elements or devices to which cables are connected. In the exemplary embodiment shown in FIG. 7, the network 702 includes at least some managed network elements or devices 704. As used herein, a "managed" network element or device 704 is a network element or device that includes some type of identifier-based physical layer management (PLM) technology for retrieving or reading identifier and other physical layer information related to one or more cables that are connected to that device 704. Examples of managed devices 704 include, without limitation, patch panels, optical distribution frames, splitter trays, switches, routers, etc., that include one or more of EEPROM-based PLM technology and RFID PLM technology.

The network 702 also typically includes unmanaged network elements and devices (not shown). As used herein, an "unmanaged" network element or device is a network element or device that does not include any such PLM technology. The identifier-based PLM technology included in each managed device 704 is configured to read the identifier and other physical layer information from non-standard cables 708. These non-standard cables 708 are also referred to here as "managed cables" 708.

In general, the identifier-based PLM technology includes a controller or other programmable processor 710 that is configured to communicate captured identifier and other physical layer information to a management system 712 over the network 702. In the example shown in FIG. 7, each controller 710 is communicatively coupled to the network 702 and the management system 712 by including a respective "management" or "non-service" port 714 in the associated managed device 704. Each management port 714 is separate from the "service" ports 716 of that device 704. However, the controller 710 in the managed devices 704 can be communicatively coupled to the network 702 using one or more of the "service" ports 716. Power can be supplied to the identifier-based PLM technology in each managed device 704 in various ways (for example, by connecting the managed device 704 to the standard AC power grid, using Power-Over-Ethernet technology, or in other ways).

Unmanaged cables can also be used with the managed network elements or devices 704. There are two types of "unmanaged" cables. One type of unmanaged cable is a standard cable that is not specially configured to be used with any type of identifier-based PLM technology. The other type of unmanaged cable is a managed cable that is used with an unmanaged system or is configured to be used with a different and incompatible type of identifier-based PLM technology than that used in the managed system. For example, a cable including only RFID-based PLM technology when connected to a managed device configured for use with EEPROM-based PLM technology is considered an unmanaged cable, and, similarly, a cable including only EEPROM-based PLM technology when connected to a managed device configured for use with RFID-based PLM technology is considered an unmanaged cable.

Figure 8:
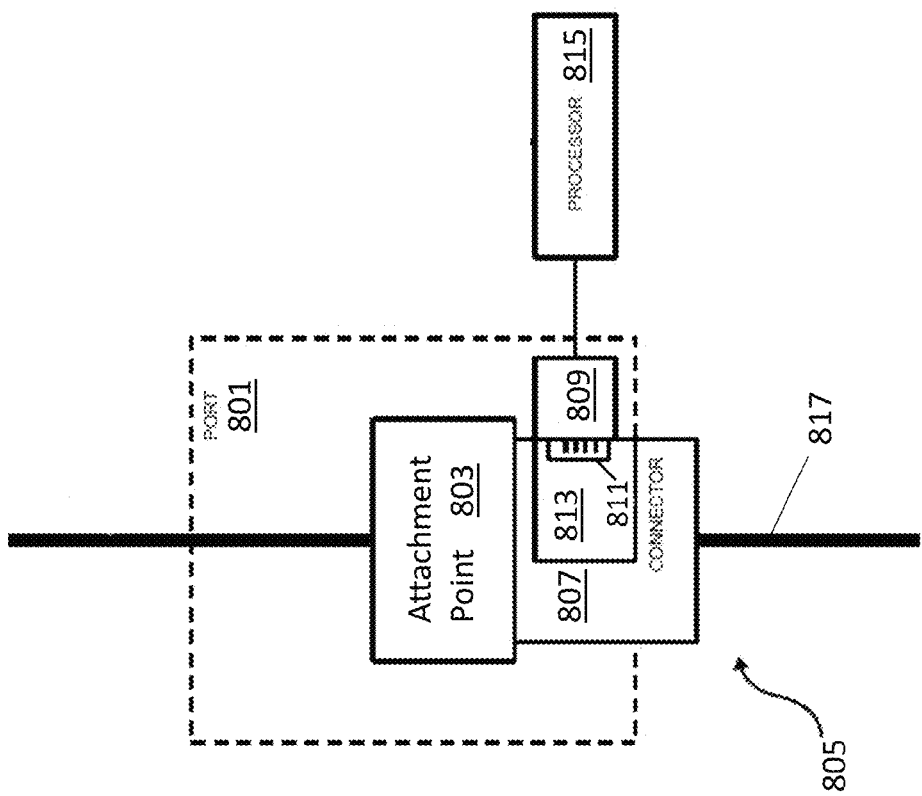
FIG. 8 is a block diagram of one embodiment of an exemplary port.

FIG. 8 depicts one high-level embodiment of an exemplary managed port 801 which can be used within a managed device in a managed system, such as managed system 700 shown in FIG. 7. It is to be understood that the port 801 is provided by way of example only and that the port 801 may include other components not shown in FIG. 8. As depicted in FIG. 8, the port 801 includes an attachment point 803. The attachment point 803 is designed for use with "connectorized" media segment 805. As used herein, a "connectorized" media segment is a segment of physical communication media 817 that includes a connector 807 at least one end of the segment 817. The attachment point 803 is implemented using a suitable connector or adapter that mates with the corresponding connector 807 of the connectorized media segment 805. The connector 807 is used to facilitate the easy and repeated attachment and un-attachment of the media segment 805 to the port 801. Examples of connectorized media segments include CAT-5, 6, and 7 twisted-pair cables having modular connectors or plugs attached to both ends (in which case, the connectors are implemented using compatible modular jacks) or optical cables having SC, LC, FC, LX.5, MTP, or MPO connectors (in which case, the connectors are implemented using compatible SC, LC, FC, LX.5, MTP, or MPO connectors or adapters). The techniques described here can be used with other types of connectors including, for example, BNC connectors, F connectors, DSX jacks and plugs, bantam jacks and plugs, as described above.

The port 801 also includes a media interface 809. The media interface 809 is configured to mate with a corresponding interface 811 in the connector 807 attached to the media segment 805. As discussed above with respect to FIGS. 6 and 7, the connector 807 includes a microcontroller 813 configured to emulate an EEPROM which is accessed via the interface 811. In particular, a processing unit 815 coupled to the media interface 809 is able to retrieve the insertion count data from the microcontroller 813 via the media interface 809 and corresponding interface 811, as discussed above. The processing unit 815 can be included in the same device in which the port 801 is located, such as a patch panel or network switch in which the port 801 is located. Alternatively, the processing unit 815 can be included in a physically separate device coupled via a network to the media interface 809, such as a management system coupled to the patch panel of the port 801.

Thus, the embodiments described herein enable the tracking of insertion counts for both managed and unmanaged cables in both managed and unmanaged systems. For example, the connector 200 is used with an unmanaged cable as it is not configured to be used with any type of identifier-based PLM technology. The connector 600 may be used with a managed cable as it is configured to be used with a specific identifier-based PLM technology, such as, but not limited to, the QUAREO™ electronic identifier technology commercially available from TE Connectivity. Both connector 200 and connector 600 enable self-tracking the insertion count when used in either a managed system or an unmanaged system.

Additionally, the embodiments described herein enable other advantages. For example, the embodiments described herein solve startup or restart ambiguity. Startup or restart ambiguity refers to when a system or device to which the connector is attached is powered on. If the device or system maintains an insertion count for the connector, there is ambiguity if the connector is already attached when the device is powered on. In particular, if the connector was attached prior to powering down or restarting the device, then detecting the attached connector on startup does not indicate a new insertion. However, if the connector was inserted when the system was turned off, then this is a new insertion. This difference cannot be detected in systems in which the device or system maintains the insertion count. However, the intelligent connectors described herein are autonomous and can distinguish between these scenarios. In addition, the embodiments described herein alleviate the problem of insertion timing miscounts. An insertion timing miscount occurs when a connector is removed at the moment a system or device is updating the insertion count. This can lead to faulty data in the insertion count. This problem is alleviated through the self-contained intelligent connectors described herein.

Figure 9:
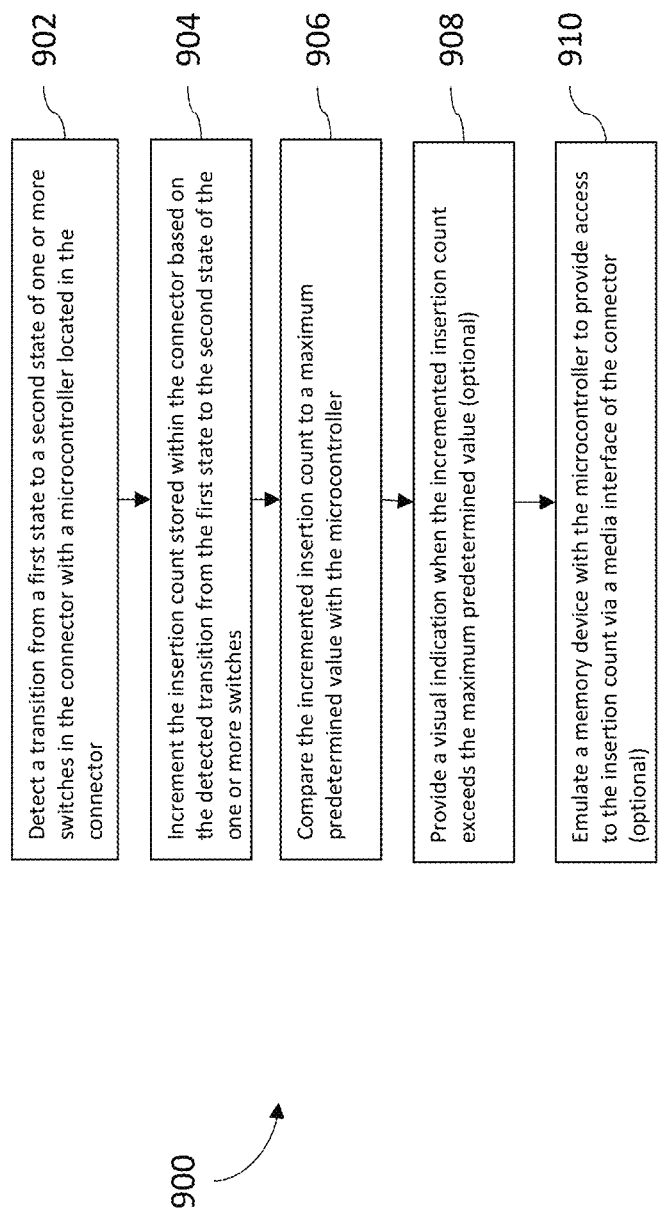
FIG. 9 is a flow chart of one embodiment of an exemplary method of tracking insertion events of a connector.

FIG. 9 is a flow chart depicting one embodiment of an exemplary method 900 of tracking insertion events of a connector. At block 902, a transition from a first state to a second state of one or more switches in the connector is detected with a microcontroller located in the connector. For example, in some embodiments, the first state is an open state and the second state is a closed state. Inserting the connector into a port cause the switch to change states. At block 904, the microcontroller increments the insertion count stored within the connector based on the detected transition from the first state to the second state of the one or more switches. In some embodiments, three or more switches are included in the connector. In some such embodiments, the microcontroller increments the insertion count when a majority of the three or more switches transition from the first state to the second state.

At block 906, the microcontroller compares the incremented insertion count to a maximum predetermined value. For example, the maximum predetermined value can be a value corresponding to a manufacturer's warranty. At block 908, the microcontroller optionally causes a visual indicator to provide a visual indication when the incremented insertion count exceeds the maximum predetermined value, in some embodiments. In some such embodiments, the microcontroller causes the visual indicator, such as an LED, to illuminate for a predetermined amount of time after inserting the connector into a port when the incremented insertion count exceeds the maximum predetermined value.

At block 910, the microcontroller optionally emulates a memory device to provide access to the insertion count via a media interface (e.g. interface 520) of the connector. For example, the interface can be implemented as a UNI/O bus compatible interface. The microcontroller emulates the addressable space, read-write/read-only partitions, Key Length Value (KLV) data structures, etc., that a network device is configured to access. A managed system may still attempt to update an insertion count KLV. The microcontroller emulates this behavior such that it appears to the managed system that the managed system has written to the memory in the connector. For example, the microcontroller may enable the managed system to write to an address in the memory device of the microcontroller. However, the microcontroller in the connector controls the actual insertion count value.

When the insertion count exceeds the manufacturer's warranty for the first time, a new 'insertion count exceeded' KLV is added to the emulated EEPROM. This KLV is not present when the warranty has not been exceeded and the absence of the insertion count exceeded KLV indicates to the host that the warranty is not exceeded and that the 'actual count' field is to be updated.

Example Embodiments

Example 1 includes a connector comprising: an interface configured to interface with a corresponding interface of a port to communicate signals between the port and a cable attached to the connector; at least one switch configured to change from a first state to a second state when the connector is inserted into the port; and a microcontroller configured to record insertion events, wherein the microcontroller increments an insertion count stored within the microcontroller when the at least one switch transitions from the first state to the second state.

Example 2 includes the connector of example 1, further comprising a visual indicator configured to provide a visual indication when the incremented insertion count exceeds a predetermined maximum value.

Example 3 includes the connector of example 2, wherein the visual indicator comprises one or more light emitting diodes.

Example 4 includes the connector of any of examples 1-3, wherein the interface comprises one of a registered jack (RJ) 45 connector, an optical fiber LC connector, or a Multi-Fiber Push On (MPO) connector.

Example 5 includes the connector of any of examples 1-4, wherein the interface is a first interface, the connector further comprising a second interface configured to interface with a corresponding media interface of the port; wherein the microcontroller is configured to emulate a memory device to provide access to the incremented insertion count via the second interface.

Example 6 includes the connector of example 5, wherein the second interface is a UNI/O bus compatible interface.

Example 7 includes the connector of any of examples 1-6, wherein the at least one switch comprises one of a mechanical switch and a capacitive switch.

Example 8 includes the connector of any of examples 1-7, further comprising three or more switches, wherein the microcontroller is configured to increment the insertion count when each switch in a majority of the three or more switches transitions from the respective first state to the respective second state.

Example 9 includes a system comprising: at least one network device having a plurality of ports, each port comprising a respective interface; and at least one cable having an intelligent connector coupled to each end of the cable; wherein each intelligent connector comprises: an interface configured to interface with a corresponding interface of a respective one of the plurality of ports to communicate signals between the respective port and the respective cable; at least one switch configured to change from a first state to a second state when the intelligent connector is inserted into the respective port; and a microcontroller configured to record insertion events, wherein the microcontroller increments an insertion count stored within the microcontroller when the at least one switch transitions from the first state to the second state.

Example 10 includes the system of example 9, wherein each intelligent connector further comprises a visual indicator configured to provide a visual indication when the incremented insertion count exceeds a predetermined maximum value.

Example 11 includes the system of example 10, wherein the visual indicator comprises one or more light emitting diodes.

Example 12 includes the system of any of examples 9-11, wherein the interface of each intelligent connector comprises one of a registered jack (RJ) 45 connector, an optical fiber LC connector, or a Multi-Fiber Push On (MPO) connector.

Example 13 includes the system of any of examples 9-12, wherein the interface in each intelligent connector is a first interface, each intelligent connector further comprising a second interface configured to interface with a corresponding media interface of the respective port; wherein the microcontroller is configured to emulate a memory device to provide access to the incremented insertion count via the second interface.

Example 14 includes the system of example 13, wherein the second interface is a UNI/O bus compatible interface.

Example 15 includes the system of any of examples 9-14, wherein the at least one switch in each intelligent connector comprises one of a mechanical switch and a capacitive switch.

Example 16 includes the system of any of examples 9-15, wherein each intelligent connector comprises three or more switches, wherein the microcontroller is configured to increment the insertion count when each switch in a majority of the three or more switches transitions from the respective first state to the respective second state.

Example 17 includes a method of tracking insertion events of a connector, the method comprising: detecting, with a microcontroller located in the connector, a transition from a first state to a second of one or more switches in the connector; incrementing, with the microcontroller in the connector, an insertion count stored within the connector based on the detected transition from the first state to the second state of the one or more switches; and comparing, with the microcontroller in the connector, the incremented insertion count to a maximum predetermined value.

Example 18 includes the method of example 17, wherein the one or more switches comprises at least three switches; and wherein incrementing the insertion count comprises incrementing the insertion count when a transition from the first state to the second state is detected for a majority of the three or more switches.

Example 19 includes the method of any of examples 17-18, further comprising: emulating a memory device, with the microcontroller in the connector, to provide access to the insertion count via a media interface of the connector.

Example 20 includes the method of any of examples 17-19, further comprising: providing a visual indication, via a visual indicator of the connector, when the microcontroller determines that the incremented insertion count exceeds the predetermined maximum value.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A connector comprising:
    an interface configured to interface with a corresponding interface of a port to communicate signals between the port and a cable attached to the connector;
    at least one switch configured to change from a first state to a second state when the connector is inserted into the port; and
    a microcontroller coupled to the at least one switch and responsive to the change from the first state to the second state to record insertion events, wherein the microcontroller increments an insertion count stored within the microcontroller when the microcontroller detects that the at least one switch transitions from the first state to the second state.

2. The connector of claim 1, further comprising a visual indicator configured to provide a visual indication when the incremented insertion count exceeds a predetermined maximum value.

3. The connector of claim 2, wherein the visual indicator comprises one or more light emitting diodes.

4. The connector of claim 1, wherein the interface comprises one of a registered jack (RJ) 45 connector, an optical fiber LC connector, or a Multi-Fiber Push On (MPO) connector.

5. The connector of claim 1, wherein the interface is a first interface, the connector further comprising a second interface configured to interface with a corresponding media interface of the port;
    wherein the microcontroller is configured to emulate a memory device to provide access to the incremented insertion count via the second interface.

6. The connector of claim 5, wherein the second interface is a UNI/O bus compatible interface.

7. The connector of claim 1, wherein the at least one switch comprises one of a mechanical switch and a capacitive switch.

8. The connector of claim 1, further comprising three or more switches, wherein the microcontroller is configured to increment the insertion count when each switch in a majority of the three or more switches transitions from the respective first state to the respective second state.

9. A system comprising:
    at least one network device having a plurality of ports, each port comprising a respective interface; and
    at least one cable having an intelligent connector coupled to each end of the cable;
    wherein each intelligent connector comprises:
    an interface configured to interface with a corresponding interface of a respective one of the plurality of ports to communicate signals between the respective port and the respective cable;
    at least one switch configured to change from a first state to a second state when the intelligent connector is inserted into the respective port; and
    a microcontroller coupled to the at least one switch and responsive to the change from the first state to the second state to record insertion events, wherein the microcontroller increments an insertion count stored within the microcontroller when the microcontroller detects that the at least one switch transitions from the first state to the second state.

10. The system of claim 9, wherein each intelligent connector further comprises a visual indicator configured to provide a visual indication when the incremented insertion count exceeds a predetermined maximum value.

11. The system of claim 10, wherein the visual indicator comprises one or more light emitting diodes.

12. The system of claim 9, wherein the interface of each intelligent connector comprises one of a registered jack (RJ) 45 connector, an optical fiber LC connector, or a Multi-Fiber Push On (MPO) connector.

13. The system of claim 9, wherein the interface in each intelligent connector is a first interface, each intelligent connector further comprising a second interface configured to interface with a corresponding media interface of the respective port;

wherein the microcontroller is configured to emulate a memory device to provide access to the incremented insertion count via the second interface.

14. The system of claim 13, wherein the second interface is a UNI/O bus compatible interface.

15. The system of claim 9, wherein the at least one switch in each intelligent connector comprises one of a mechanical switch and a capacitive switch.

16. The system of claim 9, wherein each intelligent connector comprises three or more switches, wherein the microcontroller is configured to increment the insertion count when each switch in a majority of the three or more switches transitions from the respective first state to the respective second state.

17. A method of tracking insertion events of a connector, the method comprising:

detecting, with a microcontroller located in the connector, a transition from a first state to a second of one or more switches in the connector, the microcontroller coupled to one or more switches and responsive to the transition from the first state to the second state;

incrementing, with the microcontroller in the connector, an insertion count stored within the connector based on the detected transition from the first state to the second state of the one or more switches; and comparing, with the microcontroller in the connector, the incremented insertion count to a maximum predetermined value.

18. The method of claim 17, wherein the one or more switches comprises at least three switches; and wherein incrementing the insertion count comprises incrementing the insertion count when a transition from the first state to the second state is detected for a majority of the three or more switches.

19. The method of claim 17, further comprising:

emulating a memory device, with the microcontroller in the connector, to provide access to the insertion count via a media interface of the connector.

20. The method of claim 17, further comprising:

providing a visual indication, via a visual indicator of the connector, when the microcontroller determines that the incremented insertion count exceeds the predetermined maximum value.

* * * * *